(12) United States Patent
Castillon et al.

(10) Patent No.: US 8,830,759 B2
(45) Date of Patent: Sep. 9, 2014

(54) SENSE AMPLIFIER WITH OFFSET CURRENT INJECTION

(75) Inventors: Erwin Castillon, Milpitas, CA (US); Uday Mudumba, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 404 days.

(21) Appl. No.: 13/316,301

(22) Filed: Dec. 9, 2011

(65) Prior Publication Data

US 2013/0148432 A1    Jun. 13, 2013

(51) Int. Cl.
*G11C 11/34*    (2006.01)

(52) U.S. Cl.
USPC .................................................... 365/185.21

(58) Field of Classification Search
CPC ........... G11C 2211/5645; G11C 16/28; G11C 16/26; G11C 11/5642; G11C 7/062; G11C 16/0483
USPC .................................................... 365/185.21
See application file for complete search history.

(56) References Cited

U.S. PATENT DOCUMENTS

| 5,543,745 | A  | * | 8/1996  | Notani ......................... 327/538 |
| 2003/0214277 | A1 | * | 11/2003 | Reimann ....................... 323/312 |
| 2007/0253255 | A1 | * | 11/2007 | Gallo et al. ............. 365/185.21 |
| 2010/0329025 | A1 | * | 12/2010 | Murata .................... 365/185.21 |
| 2011/0044114 | A1 |   | 2/2011  | Combe |

OTHER PUBLICATIONS

Kobayashi, Tsuguo ; A Current-Controlled Latch Sense Amplifier and a Static Power-Saving Input Buffer for Low-Power Architecture; Apr. 1993; vol. 28, No. 4, pp. 523-527; IEEE Journal of Solid-State Circuits.

* cited by examiner

*Primary Examiner* — Vanthu Nguyen
*Assistant Examiner* — Khamdan Alrobaie
(74) *Attorney, Agent, or Firm* — Fish & Richardson P.C.

(57) ABSTRACT

A sense amplifier includes a sense input node, a current mirror circuit to mirror the current on the sense input node, and a result output node. A current source supplies an offset current. The sense amplifier increases the current on the sense input node by the offset current and reduces the offset current from the mirrored current at the result output node.

15 Claims, 2 Drawing Sheets

SENSE AMPLIFIER WITH OFFSET CURRENT INJECTION

TECHNICAL FIELD

This disclosure relates generally to electronics and more particularly to sense amplifiers.

BACKGROUND

A memory cell stores information, e.g., one or more bits of information. In conventional computer memories, memory cells are arranged into arrays and accessed by word lines and bit lines. For example, flash memory stores information in an array of memory cells based on floating-gate transistors. A sense amplifier reads the information in a memory cell by sensing the current flowing from the memory cell and comparing the current to a reference current. A single sense amplifier can be used for many memory cells in an array of memory cells by appropriate configuration of word lines and bit lines.

SUMMARY

A sense amplifier includes a sense input node, a current mirror circuit to mirror the current on the sense input node, and a result output node. A current source supplies an offset current. The sense amplifier increases the current on the sense input node by the offset current and reduces the offset current from the mirrored current at the result output node.

Particular implementations of a sense amplifier can provide one or more of the following advantages: 1) the offset current can cause the voltage at the sensing input to settle faster, allowing increased read speeds from memory cells; 2) the offset current can cause the sensing input to be less sensitive to noise; and 3) lower current memory cells can be implemented without sacrificing read speeds.

The details of one or more disclosed implementations are set forth in the accompanying drawings and the description below. Other features, aspects, and advantages will become apparent from the description, the drawings and the claims.

DETAILED DESCRIPTION

Example Sense Amplifier Circuit

Figure 1:
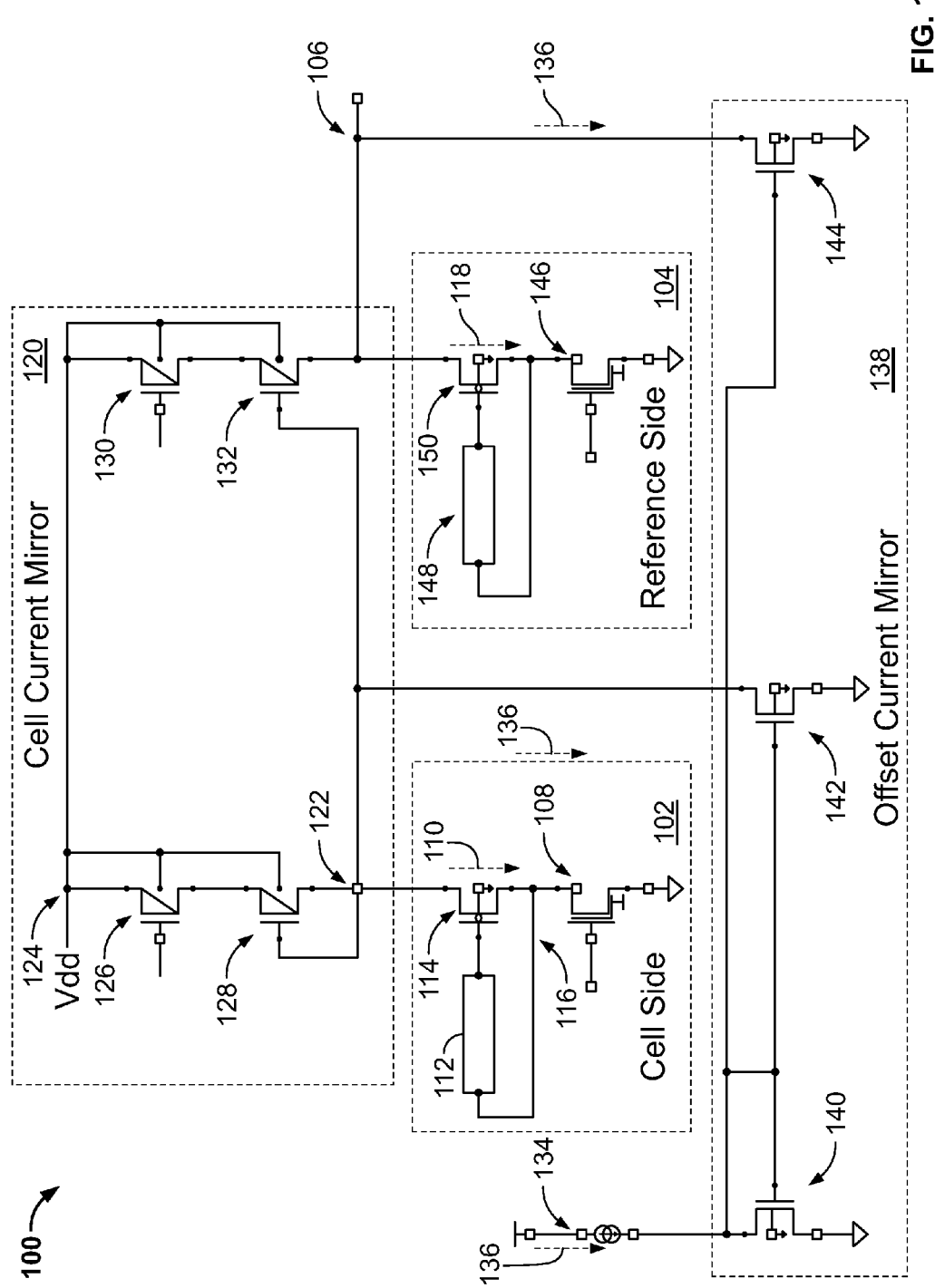
FIG. 1 is a schematic diagram of an example sense amplifier.

FIG. 1 is a schematic diagram of an example sense amplifier 100. The sense amplifier 100 receives a cell current 110 from a cell side circuit 102 and compares the cell current 110 to a reference current 118 from a reference side circuit 104. The sense amplifier 100 includes a result output node 106. A latch or other digital circuit—e.g., along with a differential amplifier—can be coupled to the result output node 106 to capture a digital value based on a result voltage at the result output node 106.

The cell side circuit 102 is configured to couple to a memory cell. For example, the cell side circuit 102 can be connected to an array of memory cells. For purposes of illustration, a single memory cell 108 is shown. The memory cell 108 can be a floating gate transistor, for example. When the memory cell 108 is selected (e.g., by applying a voltage to a control gate of a floating gate transistor), the cell current 110 flows in the cell side circuit 102. The magnitude of the cell current 110 indicates the information stored in the memory cell 108 (e.g., a large current indicates a "1" value and a small or zero current indicates a "0" value.)

The cell side circuit 102 can include a bias circuit 112 and a bias transistor 114 to maintain an appropriate bias on the memory cell 108. When the memory cell 108 is selected, the memory cell 108 can attempt to pull the voltage at a memory node 116 coupled to memory cell 108 to ground. The bias circuit 112 and bias transistor 114 work together to maintain the voltage at the memory node 116 at a substantially constant value. The bias circuit 112 senses the voltage at the memory node 116 and, if the voltage is below the constant value, applies a greater voltage to the gate of the bias transistor 114, and if the voltage is above the constant value, applies a smaller voltage to the gate of the bias transistor 114.

The sense amplifier 100 includes a cell current mirror circuit 120. The cell current mirror circuit 120 is coupled to the cell side circuit 102 at a sense input node 122. The cell current mirror circuit 120 includes a power supply node 124 that is configured to be coupled to a power supply. A first pair of transistors 126 and 128 (e.g., PFET transistors) are coupled between the power supply node 124 and the sense input node 122. A second pair of transistors 130 and 132 are coupled between the power supply node 124 and the sense input node 122. Thus the sense input node 122 can be heavily loaded due to parasitic capacitors. Parasitic capacitors can be, for example, a gate capacitor from the first pair of transistors 126 and 128, a coupling capacitor between the result output node 106 and the sense input node 122, and parasitic drain capacitors from all the transistors connected to the sense input node 122. The cell current mirror circuit 120 of FIG. 1 is an example of a current mirror circuit, and various other appropriate current mirror circuits can be used.

The sense amplifier 100 includes an offset current source 134. The offset current source 134 generates an offset current 136. The offset current source 134 is coupled to an offset current mirror circuit 138. The offset current mirror circuit 138 is configured to mirror the offset current at the sense input node 122 and at the result output node 106. For example, the offset current mirror circuit 138 can include three transistors 140, 142, and 144 of the same size, coupled gate to gate. The first transistor 140 is coupled to the offset current source 134, the second transistor 142 is coupled to the sense input node 122, and the third transistor 144 is coupled to the result output node 106.

The offset current source 134 is configured (e.g., by virtue of the offset current mirror circuit 138) to increase the cell current 110 by the offset current 136 at the sense input node 122. The cell current mirror circuit 120 mirrors the cell current 110, as modified by the offset current source, to produce a mirrored cell current. The mirrored cell current is substantially equal to the sum of the cell current 110 plus the offset current. The offset current source 134 is also configured to, at the result output node 106, reduce the mirrored input current by the offset current 136.

The reference side circuit 104 supplies the reference current 118 for comparison to the cell current 110. For example, the reference side circuit 104 can include a reference memory cell 146 and a reference bias circuit 148 and a reference bias transistor 150 that maintain an appropriate bias on the reference memory cell 146.

In operation, the sense amplifier 100 increases the cell current 110 by the offset current 136, mirrors the cell current 110 plus the offset current 136, then reduces the mirrored input current by the offset current 136 to recover the original cell current 110 for comparison to the reference current 118. The sense amplifier 100 can be configured (e.g., by virtue of the cell current mirror 120) to pull the result voltage at the result output node 106 to a power supply voltage at the power supply node 124 when the cell current 110 is greater than the reference current 118. The sense amplifier 100 can be configured to pull the result voltage at the result output node 106 to a ground voltage when the cell current 110 is smaller than the reference current 118. The result voltage at the result output node 106 depends on the difference between the cell current 110 and the reference current 118. The result voltage at the result output node 106 can be amplified to either the power supply voltage or grounded using a differential amplifier circuit, and the data can then be saved in a digital latch circuit.

The offset current 136 serves to reduce the settling time of the sense amplifier 100. The settling time is the amount of time required before the cell current 110 remains within a tolerable range. Since the operation of the sense amplifier 100 involves mirroring currents, the settling time can be increased by the sense amplifier 100 because the cell current mirror 120 also takes time to settle. The settling time of the cell current 110 is proportional to the magnitude of the cell current 110. Hence, sensing and determining the information in a lower current memory cell can take longer than sensing and determining the information in a higher current memory cell, which can affect overall read speeds from memory.

By applying the offset current 136 to the cell current 110, the cell current 110 settles faster, allowing for faster read times. Since the mirrored current thus becomes the cell current 110 increased by the offset current 136, the sense amplifier 100 reduces the mirrored current by the offset current 136 to recover the original cell current 110, while still allowing for a faster settling time. In addition to increasing the settling time, the offset current 136 can make the sense amplifier 100 comparatively less sensitive to noise, e.g., at low current levels, thus achieving more stable results.

Example Memory Circuit

Figure 2:
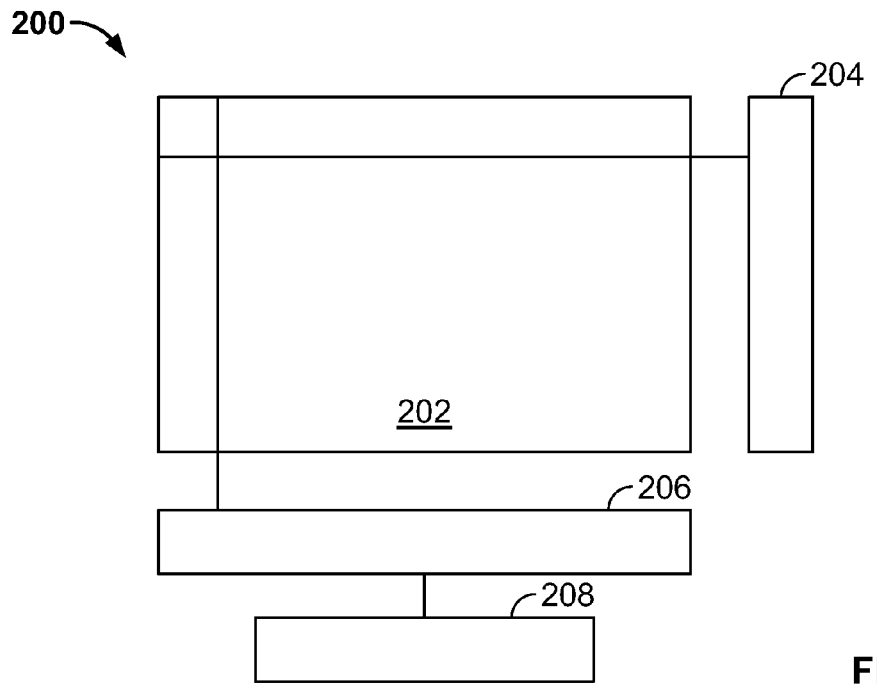
FIG. 2 is a schematic diagram of an example memory circuit.

FIG. 2 is a schematic diagram of an example flash memory array 200.

The flash memory array 200 includes an array of memory cells 202. The memory cells can be floating gate transistors. The flash memory array 200 includes a word line selector 204 coupled to word lines. Each word line is coupled to each memory cell in a respective row of the memory cells 202. The flash memory array 200 includes a bit line selector 206 coupled to bit lines to access the memory cells 202. Each bit line is coupled to each memory cell in a respective column of the memory cells 202. The word line selector 204 and the bit line selector 206 operate together to select a memory cell from the array of memory cells 202. The flash memory array 200 includes a sense amplifier 208. The sense amplifier can be the sense amplifier 100 of FIG. 1.

Example Sensing Flowchart

Figure 3:
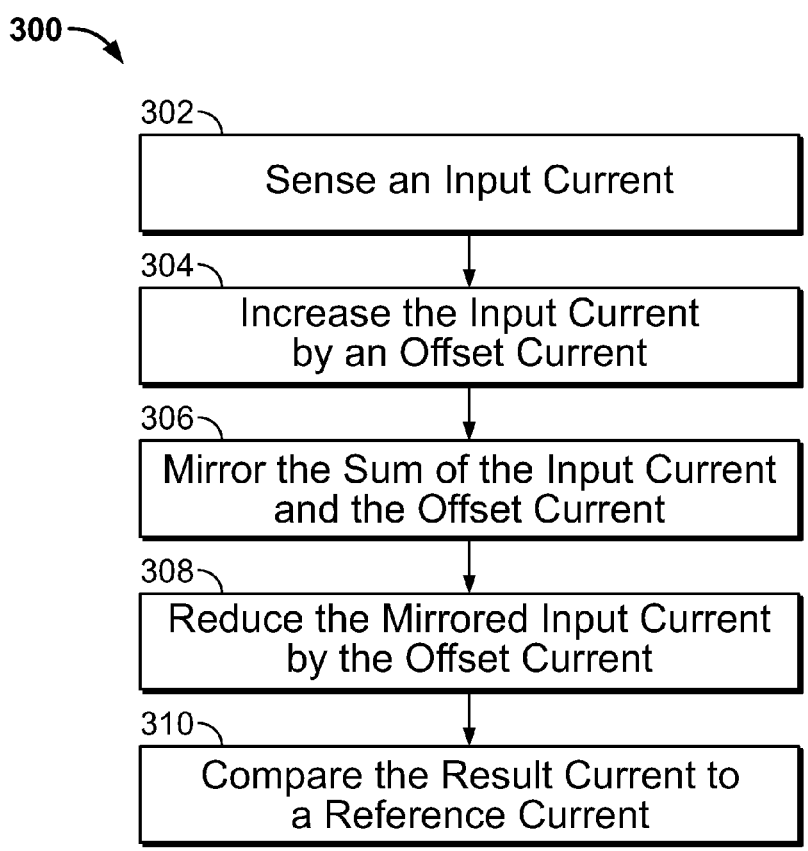
FIG. 3 is a flow diagram of an example process performed by a sense amplifier.

FIG. 3 is a flow diagram of an example process 300 performed by a sense amplifier. The sense amplifier can be the sense amplifier 100 of FIG. 1.

The sense amplifier senses an input current from a memory cell at a sense input node (step 302). The sense amplifier increases the input current by an offset current (step 304). The sense amplifier mirrors the sum of the input current and the offset current to generate a mirrored input current (step 306). The sense amplifier reduces the mirrored input current by the offset current to generate a result current at a result output node (step 308). Increasing and reducing by the offset current can include mirroring the offset current from a current source at the sense input node and the result output node. For example, mirroring the offset current can include mirroring the offset current with an offset current mirror circuit comprising a network of transistors each having a respective gate coupled to a common node.

The sense amplifier compares the result current to a reference current (step 310). For example, comparing the result current to the reference current can include pulling the result voltage to a power supply voltage when the input current is greater than the reference current and pulling the result voltage to a ground voltage when the reference current is greater than the input current. The sense amplifier can capture a digital value based on a result voltage at the result output node.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A sense amplifier comprising:
a sense input node configured to receive an input current;
a current mirror circuit coupled to the sense input node and configured to produce a mirrored input current;
a result output node coupled to the current mirror circuit and a reference current circuit; and
an offset current source coupled to the sense input node and the result output node, wherein the offset current source is configured to:
increase the input current by an offset current at the sense input node; and
reduce the mirrored input current by the offset current at the result output node.

2. The sense amplifier of claim 1, further comprising a latch circuit coupled to the result output node and configured to capture a digital value based on a result voltage at the result output node.

3. The sense amplifier of claim 1, wherein the current mirror circuit comprises a network of transistors coupled to a power supply node, wherein the network of transistors is configured so that the result voltage is pulled to a power supply voltage at the power supply node when the input current is greater than the reference current and the result voltage is pulled to a ground voltage when the reference current is greater than the input current.

4. The sense amplifier of claim 1, further comprising an offset current mirror circuit, wherein:
the offset current source, the sense input node, and the result output node are coupled to the offset current mirror circuit; and the offset current mirror circuit is configured to mirror the offset current from the offset current source at the sense input node and the result output node.

5. The sense amplifier of claim 4, wherein the offset current mirror circuit comprises a network of transistors each having a respective gate coupled to a common node.

6. A flash memory array comprising:
 a plurality of memory cells, each memory cell comprising a floating gate transistor;
 a word line selector coupled to a plurality of word lines, each word line being coupled to each memory cell in a respective row of the plurality of memory cells;
 a bit line selector coupled to a plurality of bit lines, each bit line being coupled to each memory cell in a respective column of the plurality of memory cells; and
 a sense amplifier comprising:
  a sense input node configured to receive an input current;
  a current mirror circuit coupled to the sense input node and configured to produce a mirrored input current;
  a result output node coupled to the current mirror circuit and a reference current circuit; and
  an offset current source coupled to the sense input node and the result output node, wherein the offset current source is configured to:
   increase the input current by an offset current at the sense input node; and
   reduce the mirrored input current by the offset current at the result output node.

7. The flash memory array of claim 1, further comprising a latch circuit coupled to the result output node and configured to capture a digital value based on a result voltage at the result output node.

8. The flash memory array of claim 1, wherein the current mirror circuit comprises a network of transistors coupled to a power supply node, wherein the network of transistors is configured so that the result voltage is pulled to a power supply voltage at the power supply node when the input current is greater than the reference current and the result voltage is pulled to a ground voltage when the reference current is greater than the input current.

9. The flash memory array of claim 1, further comprising an offset current mirror circuit, wherein:
 the offset current source, the sense input node, and the result output node are coupled to the offset current mirror circuit; and
 the offset current mirror circuit is configured to mirror the offset current from the offset current source at the sense input node and the result output node.

10. The flash memory array of claim 9, wherein the offset current mirror circuit comprises a network of transistors each having a respective gate coupled to a common node.

11. A method performed by a sense amplifier, the method comprising:
 sensing an input current from a memory cell at a sense input node;
 increasing the input current by an offset current;
 mirroring the sum of the input current and the offset current to generate a mirrored input current;
 reducing the mirrored input current by the offset current to generate a result current at a result output node; and
 comparing the result current to a reference current.

12. The method of claim 11, further comprising capturing a digital value based on a result voltage at the result output node.

13. The method of claim 11, wherein comparing the result current to the reference current includes pulling the result voltage to a power supply voltage when the input current is greater than the reference current and pulling the result voltage to a ground voltage when the reference current is greater than the input current.

14. The method of claim 11, further comprising mirroring the offset current from a current source at the sense input node and the result output node.

15. The method of claim 14, wherein mirroring the offset current includes mirroring the offset current with an offset current mirror circuit comprising a network of transistors each having a respective gate coupled to a common node.

* * * * *